United States Patent [19]

Shih

[11] Patent Number: 5,741,431

[45] Date of Patent: Apr. 21, 1998

[54] LASER ASSISTED CRYOETCHING

[75] Inventor: Ming-Chang Shih, Hsinchu, Taiwan

[73] Assignee: Industrial Technology Research Institute, Hsinchu, Taiwan

[21] Appl. No.: 857,163

[22] Filed: May 15, 1997

[51] Int. Cl.[6] .............................. B44C 1/22; H01L 21/302
[52] U.S. Cl. .................... 216/65; 216/74; 438/708
[58] Field of Search ...................... 216/65, 66, 74, 216/75, 79; 438/708

[56] References Cited

U.S. PATENT DOCUMENTS 5,112,645  5/1992  Sekine et al. ........................ 156/643

FOREIGN PATENT DOCUMENTS 59-086222  5/1984  Japan .

OTHER PUBLICATIONS

"Patterned, Photon–Driven, Cryoetching of GaAs and AlGaAs" by MC Shih et al, J. Vac. Sci Technology, vol. 13, 1995, pp. 43–54.

"Surface Chemical Reactions Studied by Laser Spectroscopy"; Kawasaki; 1990; Reza Kenkyu, 18(4), pp. 194–202; ISSN: 0387–0200.

*Primary Examiner*—R. Bruce Breneman
*Assistant Examiner*—George Goudreau
*Attorney, Agent, or Firm*—George O. Saile; Stephen B. Ackerman

[57] ABSTRACT

Effective etching of several materials, including gallium nitride and gallium arsenide, without post etch surface damage has been achieved by using a mix of equal proportions of chlorine and methane. A sample is first cooled to a temperature of around 140° K and is then irradiated by a series of pulses from a UV laser (for example a 193 nm ArF excimer laser). Using fluences of about 400 mJ/cm$^2$ per pulse at repetition rates of about 10 pulses/second, an etch rate for gallium nitride of about 0.7 Angstroms per pulse was achieved. Typical pressure for the chlorine methane mix was about 2 mtorr. To achieve selective etching a number of approaches are possible including contact masking, projection printing, raster scanning, and moveable shadow masking with collimated laser light.

19 Claims, 6 Drawing Sheets

LASER ASSISTED CRYOETCHING

BACKGROUND OF THE INVENTION

(1) Field of the Invention

The invention relates to the general field of reactive gas etching, more particularly to laser assisted cryoetching.

(2) Description of the Prior Art

Reactive ion etching, wherein highly reactive species are generated from otherwise relatively inert species through formation of a gas plasma, has been widely used in the semiconductor industry. While this has proved to be a very effective and versatile process, it does have several drawbacks. In particular, energetic ions present in the plasma are known to cause mechanical damage to the surface that remains after etching has been terminated, down to a depth of about 100 Angstroms. In addition, electrical damage, down to a depth of about 1,000 Angstroms, is also known to occur as a result of trapped charge. As the layers used in integrated circuits grow ever thinner, damage of either type can no longer be tolerated.

A second disadvantage of reactive ion etching is that it is not fully anisotropic. In order to etch cavities that have near vertical sides, it is necessary to include in the etchant gas an organic material that decomposes during etching and deposits a protective coating on the cavity walls. Said coating, while effective, is often difficult to completely remove at the conclusion of etching.

With a view to overcoming the above mentioned difficulties, laser assisted cryoetching has recently been used in place of reactive ion etching. The basic principles underlying laser assisted cryoetching are schematically illustrated in FIGS. 1a and 1b. FIG. 1a shows a material 1, part of whose upper surface has been masked by contact mask 2. Down pointing arrows 3 represent molecules of a gas that does not normally react with 1. When 1 is cooled to temperatures in the liquid nitrogen range, a monolayer of 3 will condense on 1 by physisorption.

In the absence of any further action, the physisorbed layer has no effect on 1. If, however, this layer is now irradiated by a suitable laser beam, schematically shown as large arrow 4 in FIG. 1b, some of the physisorbed molecules will be dissociated through interaction with the laser, assuming the latter has sufficient energy (sufficiently short wavelength). The dissociation products, being free radicals, tend to be highly reactive and some, or all, may attack the surface of 1. The resulting reaction products, symbolized by arrow 5, then leave the surface together with undissociated physisorbed molecules, symbolized by arrows 6, the latter being desorbed because of local heating induced by the laser beam.

The process just described has the advantage of producing neither mechanical nor electrical damage at or near the surface. Additionally, since etching occurs only where the laser has been shone, it is a fully anisotropic process and the provision and subsequent removal of protective organic polymer layers is not needed. Finally, since light is involved, the formation of etch patterns is not limited to contact masks, other optical methods such as projection printing and shadow masking now being possible.

A disadvantage of laser assisted cryogenic etching is that it is not as widely applicable as reactive ion etching and finding the right species for etching a given material (at a reasonable rate) can often be difficult.

Laser assisted cryogenic etching has been described in detail in "Patterned, photon-driven, cryoetching of GaAs and AlGaAs" by M. C. Shih et al. in J. Vac. Sci. Technol. vol. 13 1995 pp. 43–54. Pure chlorine or chlorine diluted with argon was used together with a 193 nm ArF excimer laser. The material being etched was cooled to a temperature of about 140° K (Kelvin) and etch rates of about 0.25 Angstroms/pulse were achieved.

SUMMARY OF THE INVENTION

It has been an object of the present invention to provide a process for etching that results in little or no mechanical or electrical damage to surfaces remaining after etching is complete.

A further object of the present invention has been to provide an etching process wherein non-planar etch fronts may be obtained.

Yet another object of the present invention has been to provide an etching process that results in cavities having vertical sidewalls, without the need to provide an organic protective lining for said sidewalls.

A still further object of the present invention has been to provide a process for effectively etching gallium nitride.

These objects have been achieved by etching in a mix of equal proportions of chlorine and methane. The sample is first cooled to a temperature of around 140° K and is then irradiated by a series of pulses from a UV laser (for example a 193 nm ArF excimer laser). Using fluences of about 400 mJ/cm$^2$ per pulse at repetition rates of about 10 pulses/second, an etch rate for gallium nitride of about 0.7 Angstroms per pulse was achieved. Typical pressure for the chlorine methane mix was about 2 mtorr. To achieve selective etching a number of approaches are possible including contact masking, projection printing, raster scanning, and moveable shadow masking with collimated laser light.

DESCRIPTION OF THE PREFERRED EMBODIMENTS

The key feature of the present invention is that a mixture of reactive gases, notably chlorine and methane, is used instead of a single reactive gas. That, together with careful selection of etching conditions, including laser type, laser power and temperature during etching have allowed us to achieve high etch rates of the order of 2,000 Angstroms/minute without any associated surface damage.

Our attention has focussed mainly on gallium nitride, a material that has been difficult to etch at reasonable rates using conventional laser assisted cryoetching. Thus, the embodiments described below will be presented in terms of gallium nitride but it is important to note that the process of the present invention has also been successfully applied to other materials, including gallium arsenide, III-V intermetallic compounds, silicon, and lithium, niobium, and strontium barium carbite.

Figure 1A:
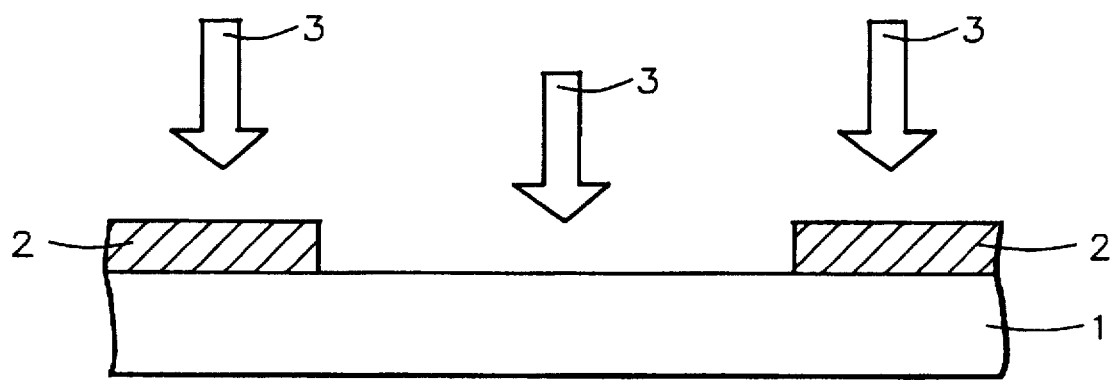
FIG. 1 illustrates the basic physical principles on which the present invention is based.
Figure 1B:
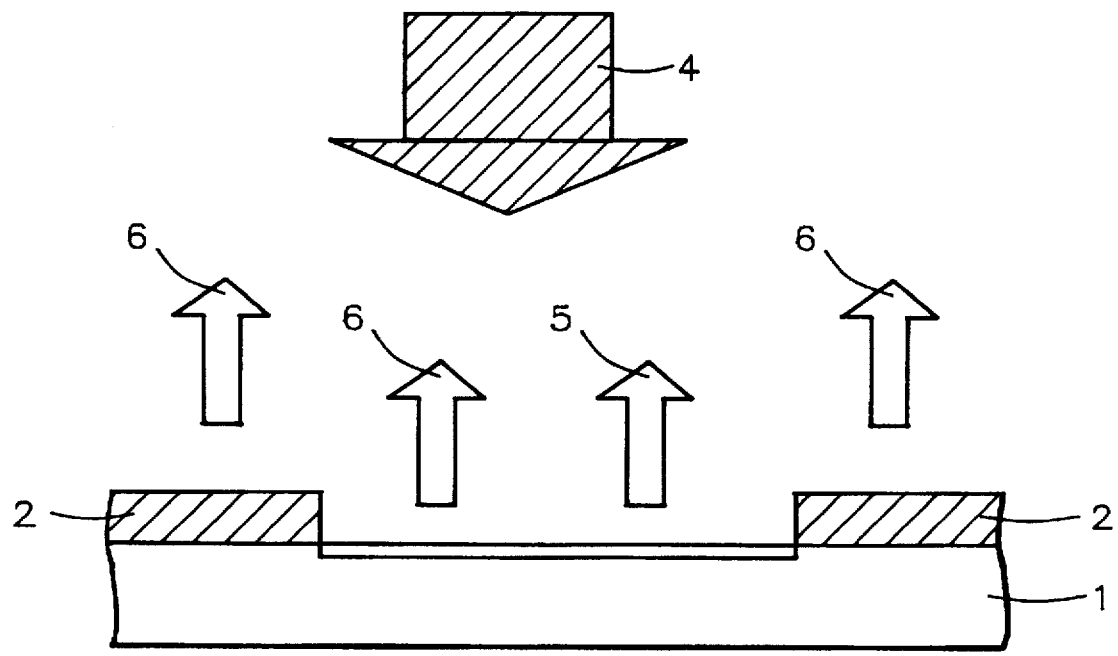
Figure 2:
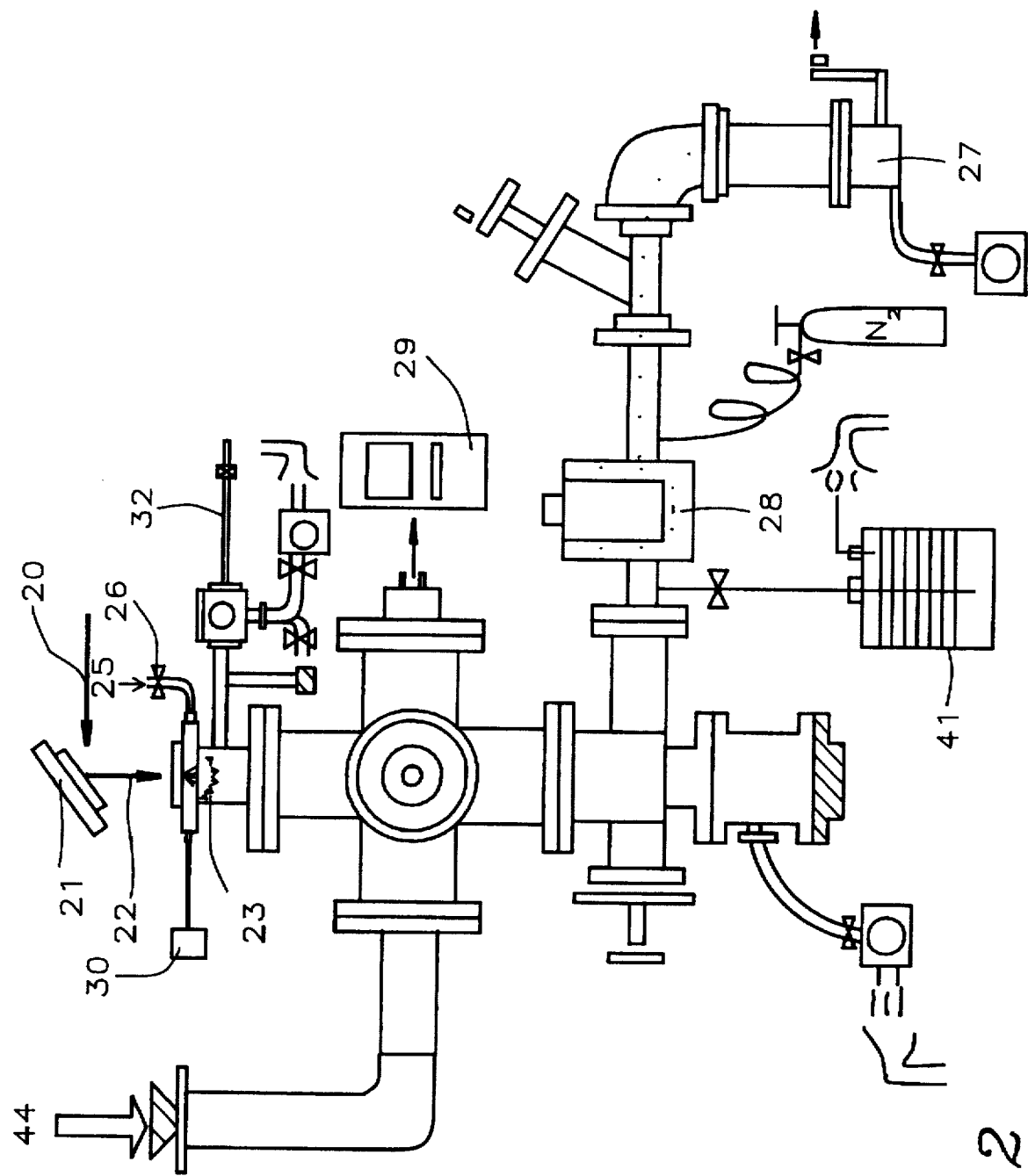
FIG. 2 shows the physical system used to implement the process of the present invention.

In FIG. 2 we show the apparatus that was used to implement the process of the present invention. Laser beam 20, emitted by a 193 nm ArF excimer, a 248 nm KrF excimer, or similar, laser (not shown), is reflected at mirror 21 and directed into etching chamber 23 as beam 22. Chamber 23 is first evacuated to a pressure of less than about $10^{-6}$ torr and then chlorine and methane gases (99.999% pure), symbolically shown as arrow 25, are introduced. Normally, the two gases are present in equal quantities but the molecular ratio of chlorine to methane could have been anywhere from about 1:1 to 5:1.

The sample is loaded and unloaded through the sample load-lock subsystem 32. The pressure of the chlorine-methane mix is maintained in the range of from about 1 to 10 mtorr (2 mtorr being our preferred value) as a dynamic balance between diffusion pump 27 and flow valve 24. The pressure is monitored by means of pressure gauges 30. The sample stage inside chamber 23 is cooled to a temperature between about 120° and 150° K (140° K being our preferred value) by means of liquid nitrogen, which is admitted through port 24, in combination with temperature controller 29. Liquid nitrogen trap 28 is inserted in the vacuum line so as to trap, and prevent back-diffusion of, any volatile reaction products produced by the etch process. Occasionally, the corrossive gases trapped by liquid nitrogen cold trap 28 during etching are diluted by dry nitrogen and purged through exhausted gases processor 41.

Figure 3:
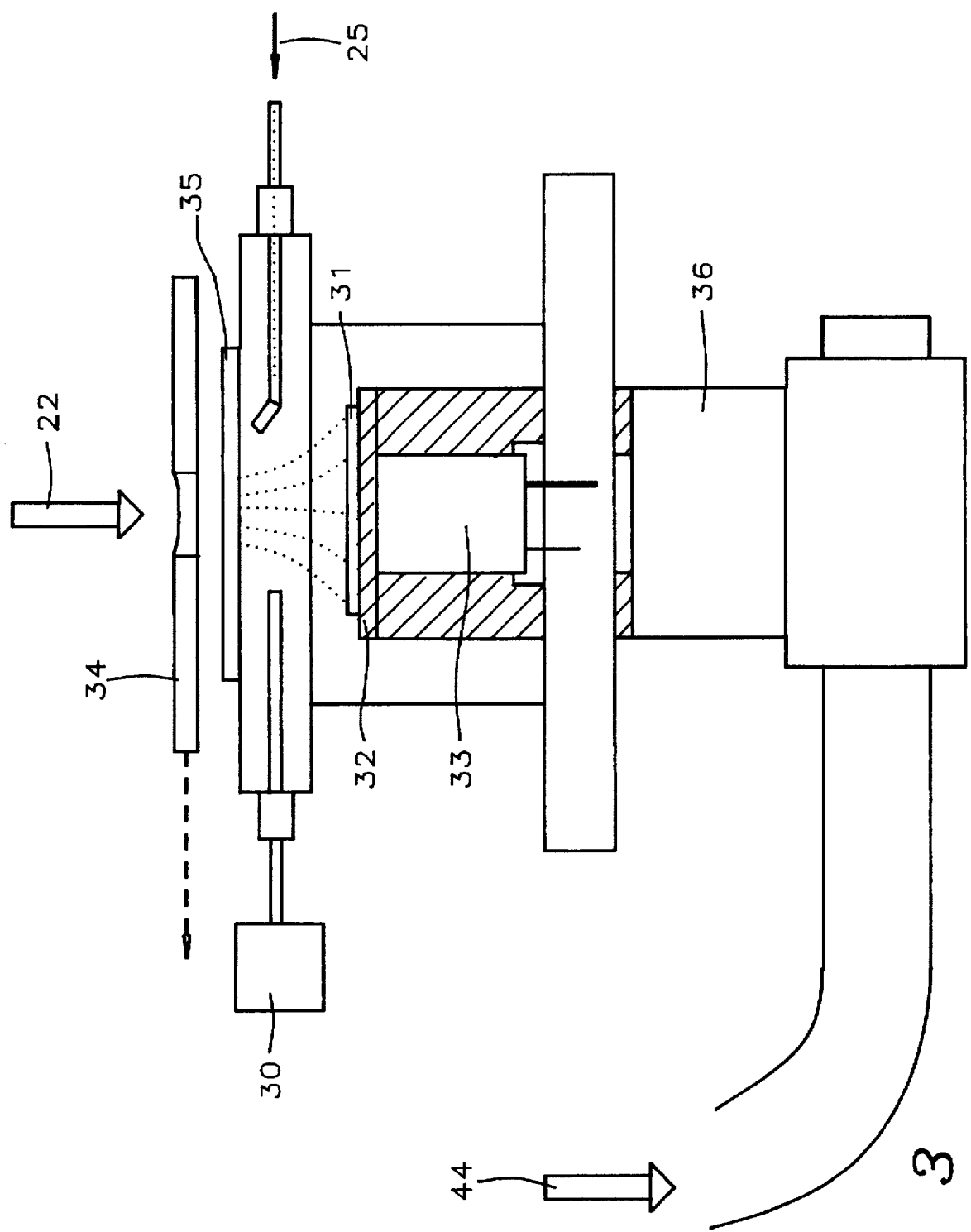
FIG. 3 is a closeup of part of FIG. 2.

In FIG. 3 a closeup view of etching chamber 23 is shown. Sample 31 is typically, though not necessarily, a layer of gallium nitride that has been deposited onto a sapphire substrate. It rests on sample holder 32 (made of molybdenum) which is cooled through thermal contact with copper heat sink 36. The latter is in turn cooled by means of liquid nitrogen that has been admitted through port 44. Heater 33, controlled by external controller 29 (see FIG. 2), is used to raise the temperature of the sample the requisite number of degrees above liquid nitrogen temperature.

To initiate etching, laser beam 22 is directed at the sample through UV transparent window 35 in the form of a series of pulses. Energy fluence per pulse is in the range of from about 100 to 800 mJ/cm$^2$ (with about 400 mJ/cm$^2$ being most commonly used) at pulse rates in the range of from about 5 to 60 pulses per second (with about 10 pulses per second being most commonly used).

Figure 4:
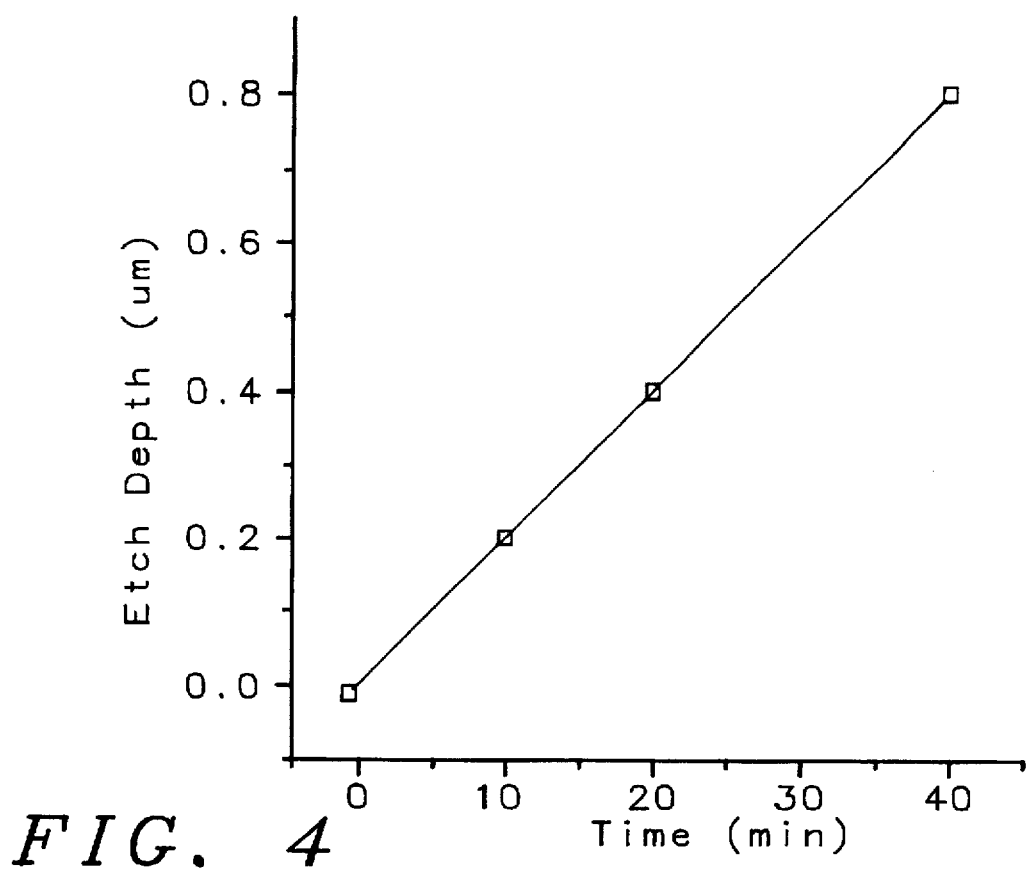
FIG. 4 is a curve of etch depth vs. time for a layer of gallium nitride etched using the process of the present invention.

A typical curve for gallium nitride of etch depth in microns vs. time in minutes is shown in FIG. 4. The conditions used were as follows:

partial pressures of chlorine and methane were each 1 mtorr; energy fluence per pulse was 200 mJ/cm$^2$; pulse rate was 5 per second.

As can be seen this resulted in an etch rate of 200 Angstroms per minute, corresponding to an etch rate of 2/3 Angstrom per pulse. The pulse rate was readily increased to 50 pulses per second, corresponding to an etch rate of 2,000 Angstroms per minute, without introducing any undesirable thermal effects. We believe this to be a significant improvement over previously reported etch rates for gallium nitride by laser assisted cryoetching.

Figure 5:
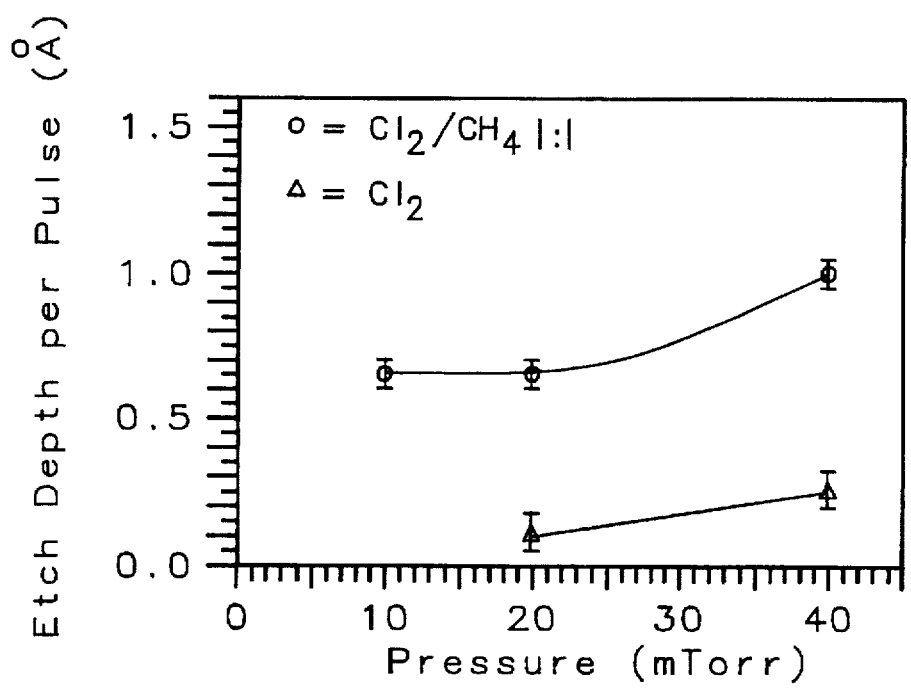
FIGS. 5–7 are curves showing the dependence of etch depth per pulse on pressure, temperature, and incident fluence respectively.
Figure 6:
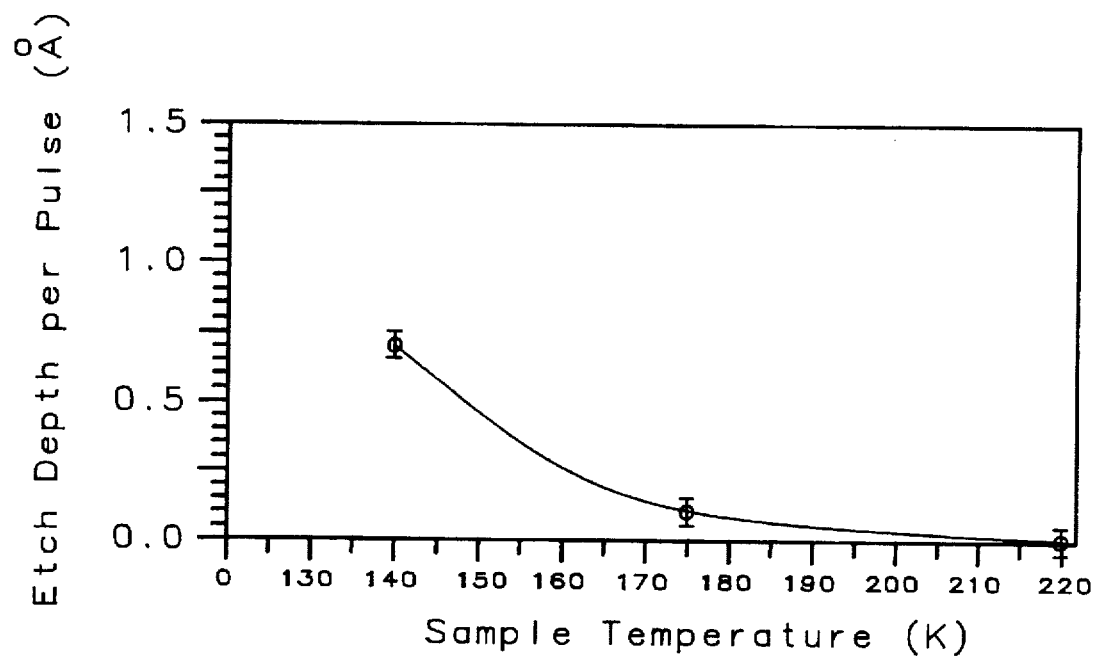
Figure 7:
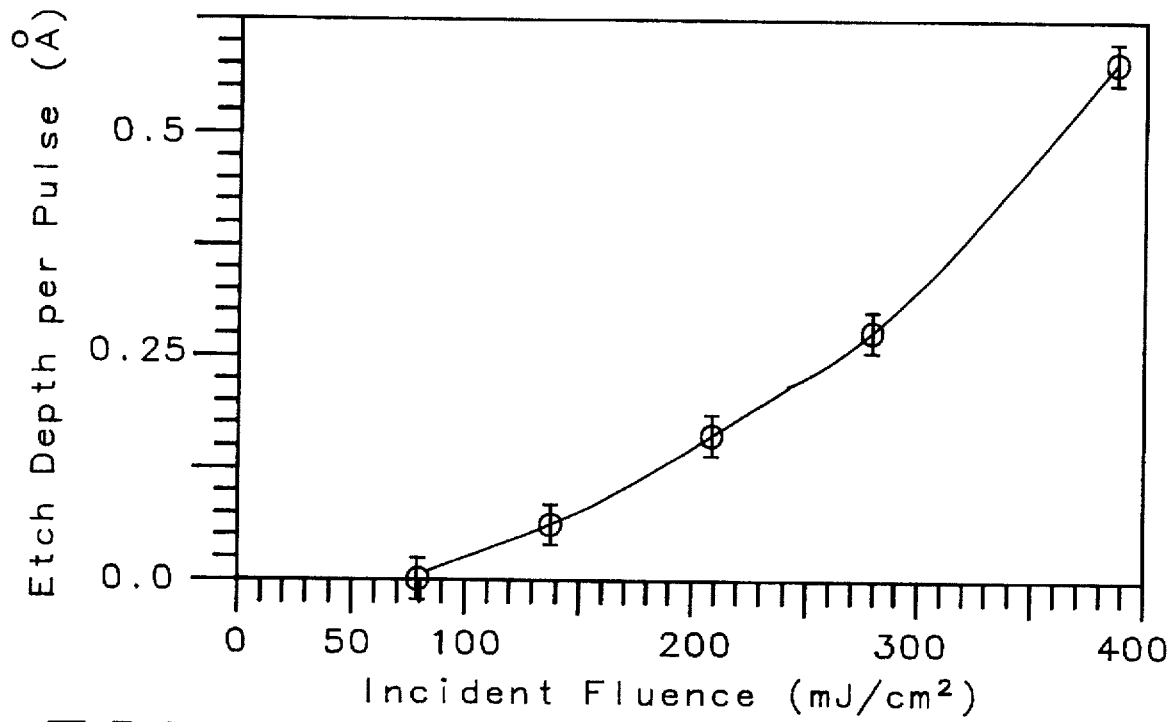

In order to determine the optimum conditions for etching, the influence of several variables on the etch depth per pulse achieved for the gallium nitride/chlorine methane system was investigated. FIGS. 5, 6, and 7 show the variation with total pressure, sample temperature, and fluence per pulse respectively. It can be seen that pressures of only a few mtorr are sufficient while temperatures somewhat below 130° K are needed. The sudden rise in etch rates for fluences above 300 mJ/cm$^2$ seen in FIG. 7 is thought to occur because of laser heating effects.

As discusssed earlier, the fact that light is being used to control etching (as opposed to the etchant itself) allows several options in the achievement of selective etching to produce etch patterns. In a first embodiment of the process of the present invention, a contact mask is used to keep laser light away from areas that are not to be etched. Such a mask is first deposited as a uniform layer covering the entire surface and is then protected with a patterned layer of photoresist following which the unprotected areas are remove by etching in standard fashion. As material for the contact mask, we have found silicon nitride, gold, chromium, or chrome-gold to be suitable.

In a second embodiment of the process of the present invention, an external mask is used together with a suitable image forming system so that an image, in laser light, of the areas to be etched is projected onto the surface of the gallium nitride. Because of the very short wavelength of the laser light, reflection optics and/or quartz lenses need to be used. It is also possible to use a half-tone (as opposed to full contrast) mask so that not all areas are etched to the same depth.

Figure 8:
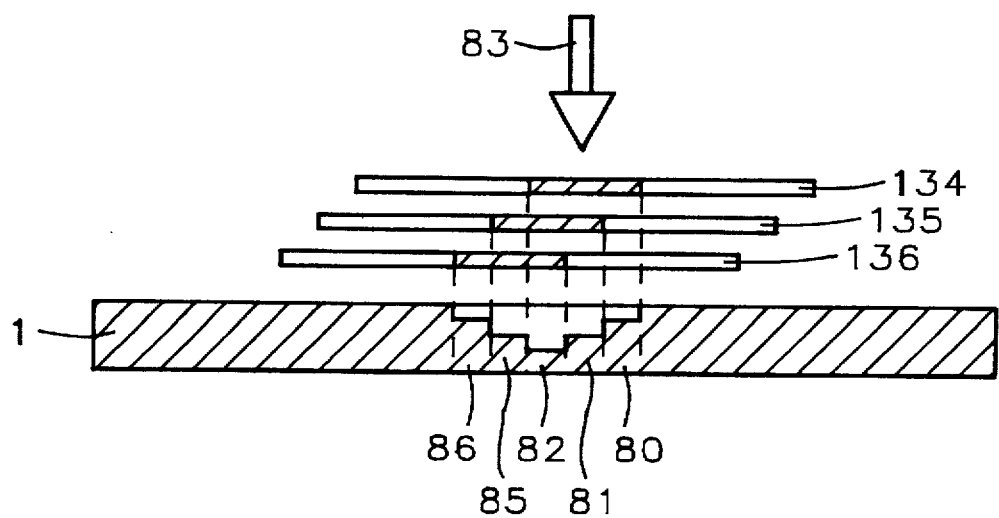
FIG. 8 shows the etch profile obtained by etching, according to the process of the present invention, through a moveable shadow mask using collimated laser light.

Because of the relatively high cost of an ultraviolet imaging system, a third embodiment of the present invention uses parallel (collimated) laser light together with a shadowing mask. This has been illustrated in FIG. 8. The beam of collimated light is symbolized by arrow 83. Only a single shadow mask 134 is used but it may be moved into several different positions while etching is under way. For purposes of illustration this has been shown as two additional masks 135 and 136.

An important advantage of the moveable shadow mask approach is that it is readily used to etch cavities of non-uniform depth. In the example, while the shadow mask is in position 134, areas 80, 81, and 82 are being etched. In position 135, areas 81, 82, and 85 are being etched and, in position 136, areas 82, 85, and 86 are being etched. Assuming equal etching times and rates for each of the three positions, it is readily seen that area 82 receives three times as much etch as areas 80 and 86 while areas 81 and 85 receive twice as much. This results in the etch profile seen in FIG. 8. It is clear that, through variations of the times for which the shadow mask is located in different positions, a wide range of etch profiles may be produced.

In a fourth embodiment of the process of the present invention, the laser beam is focussed to a fine point and is then caused to scan back and forth across the gallium nitride surface so as to form a raster pattern which would provide the necessary image for selective etching. Modulation of the intensity of the laser need not be limited to fully on or fully off, thereby providing a means for controlling both the etch depth as well as the etched area.

While the invention has been particularly shown and described with reference to the preferred embodiments thereof, it will be understood by those skilled in the art that various changes in form and details may be made without departing from the spirit and scope of the invention.

What is claimed is:

1. A process for etching a material, comprising:

cooling said material to a temperature;

immersing said material in an atmosphere of chlorine and methane that is at a pressure; and irradiating the material with laser pulses having a fluence and a repetition rate.

2. The process of claim 1 wherein said temperature is between about 120° and 150° K.

3. The process of claim 1 wherein said pressure is between about 1 and 10 millitorr.

4. The process of claim 1 wherein said material is taken from the group consisting of gallium nitride, gallium arsenide, silicon, lithium, niobium, and strontium barium carbite.

5. The process of claim 1 wherein said laser pulses are emitted by a 193 nm ArF excimer laser or a 248 nm KrF excimer laser.

6. The process of claim 1 wherein the fluence of each of said laser pulses is between about 500 and 800 mJ/sq. cm. and said repetition rate is between about 5 and 60 pulses per second.

7. A process for selectively etching a material, comprising:

cooling said material to a temperature;

immersing said material in an atmosphere of chlorine and methane that is at a pressure; and irradiating the material, in selected areas, with laser pulses having a fluence and a repetition rate.

8. The process of claim 7 wherein said temperature is between about 120° and 150° K.

9. The process of claim 7 wherein said pressure is between about 1 and 10 millitorr.

10. The process of claim 7 wherein said material is taken from the group consisting of gallium nitride, gallium arsenide, silicon, lithium, niobium, and strontium barium carbite.

11. The process of claim 7 wherein said laser pulses are emitted by a 193 nm ArF excimer laser or a 248 nm KrF excimer laser.

12. The process of claim 7 wherein the fluence of each of said laser pulses is between about 500 and 800 mJ/sq. cm. and said repetition rate is between about 5 and 60 pulses per second.

13. The process of claim 7 wherein the step of irradiating the material in selected areas further comprises forming a mask, in contact with said material, that is opaque to said laser light and inert with respect to said atmosphere.

14. The process of claim 13 wherein said mask is silicon nitride or gold or chromium or chrome-gold.

15. The process of claim 7 wherein the step of irradiating the material in selected areas further comprises projecting a laser image onto said material.

16. The process of claim 7 wherein the step of irradiating the material in selected areas further comprises raster scanning a focussed beam of the laser over the material.

17. The process of claim 7 wherein the step of irradiating the material in selected areas further comprises collimating said laser light, inserting a shadow mask between the laser and said material and moving the shadow mask while etching proceeds.

18. The process of claim 7 wherein the material is a thin layer.

19. The process of claim 7 wherein the molecular ratio of chlorine to methane is between about 1:1 and 5:1.

* * * * *